(12) United States Patent
Wichner

(10) Patent No.: US 7,939,746 B2
(45) Date of Patent: May 10, 2011

(54) SOLAR PANELS FOR RECEIVING SCATTERED LIGHT

(75) Inventor: Brian Donald Wichner, Otter Rock, OR (US)

(73) Assignee: Brian Wichner, Otter Rock, OR (US)

( * ) Notice: Subject to any disclaimer, the term of this patent is extended or adjusted under 35 U.S.C. 154(b) by 0 days.

(21) Appl. No.: 12/506,543

(22) Filed: Jul. 21, 2009

(65) Prior Publication Data

US 2010/0024863 A1 Feb. 4, 2010

Related U.S. Application Data

(60) Provisional application No. 61/084,605, filed on Jul. 29, 2008.

(51) Int. Cl.
*H02N 6/00* (2006.01)
*H01L 31/042* (2006.01)
(52) U.S. Cl. .................. 136/244; 136/243; 136/245
(58) Field of Classification Search .................. None
See application file for complete search history.

(56) References Cited

U.S. PATENT DOCUMENTS

| 4,210,121 | A  | * | 7/1980 | Stark ............................. 126/573 |
| 4,398,053 | A  | * | 8/1983 | Orillion ......................... 136/248 |
| 4,835,918 | A  | * | 6/1989 | Dippel ............................. 52/63 |
| 7,658,071 | B1 | * | 2/2010 | McDermott .................. 60/641.8 |
| 2005/0166953 | A1 | * | 8/2005 | Baldeschwieler ............ 136/246 |
| 2008/0223431 | A1 | * | 9/2008 | Chu ............................... 136/245 |

OTHER PUBLICATIONS

Modeling Single- and Poly-crystal Silicon Solar Cells, by Crosslight Software, Inc., www.crosslight.com, copyright Aug. 2006, pp. 20-40.
VPP-66 Solar Power Pack, Beacon solar charger, by Vega Industries Ltd., 21 Heriot Drive, Porirua 5022, New Zealand, released on Dec. 15, 2008.
PHYSORG.com, 'Nano-Manhattan' 3D solar cells boost efficiency (Update), Published 14:33 EST, Apr. 11, 2007.

\* cited by examiner

*Primary Examiner* — Alexa D Neckel
*Assistant Examiner* — Shannon Gardner
(74) *Attorney, Agent, or Firm* — Brian Wichner, Patent Agent

(57) ABSTRACT

The subject matter disclosed herein relates to solar panels to generate electrical energy. In particular, solar panels configured to efficiently receive scattered light are disclosed.

13 Claims, 8 Drawing Sheets ent on a flat solar panel, according to an embodiment. During sunny weather, e.g., no clouds, light 120 from the sun may travel directly to a solar panel 100. A solar panel may change its angle so that sun light is incident perpendicular to the surface of the solar panel to increase solar gain efficiency.
SOLAR PANELS FOR RECEIVING SCATTERED LIGHT

RELATED APPLICATIONS

This patent application claims benefit of and priority to U.S. Provisional Patent Application 61/084,605, filed Jul. 29, 2008, and titled "Solar Panels for Receiving Scattered Light", and which is incorporated in its entirety or a portion thereof by reference herein.

BACKGROUND

1. Field

The subject matter disclosed herein relates to solar panels to generate electrical energy. In particular, solar panels configured to efficiently receive scattered light, such as during cloudy weather, are disclosed.

2. Information

Energy generation is of paramount importance to a developed country and its society. Petroleum-based energy sources are diminishing so that alternative sources of energy are becoming increasingly important. Among such alternative energy sources, solar energy generation holds promise to be an important candidate as a primary source of energy. Solar energy may be generated by solar panels, which include semiconductor materials configured in a solar cell to generate electrical energy and arranged in an array to sum the energy generated by individual solar cells. Among at least several reasons for this promising energy source: sunlight is virtually unlimited and free, and material for producing solar energy-generating panels is relatively inexpensive. On the other side of the coin, sunlight is available in limited quantities in many regions of the globe due to prevailing weather patterns that produce cloudy skies, which block a portion of sunlight. Also, although materials for producing solar panels are relatively inexpensive, manufacturing solar panels may be relatively expensive due to processing costs. Accordingly, current limitations on the use of energy-generating solar panels include geographical location due to weather, and the deployed number of solar panels due to expense.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components, and/or circuits have not been described in detail so as not to obscure claimed subject matter.

Cloudy skies are often considered to produce less solar radiation than sunny skies. But such a simple comparison may be misleading. For example, cloudy skies may produce more solar radiation in an area that would have been a shadow if the skies were sunny. In other words, more solar radiation may reach such shadow areas via scattered sunlight from clouds. Without clouds, there may be no sunlight scattering to reach the shadow area—solar radiation may only reach areas and/or surfaces that are in direct line-of-sight of the sun during sunny weather.

In an embodiment, a solar panel, which may comprise one or more individual solar panels, may be configured in a three-dimensional shape to increase its overall surface area, while keeping its footprint area, that is, the coverage area on the earth surface or a rooftop for example, constant. Though surface area may be so increased, geometrical positioning of surfaces of such a three-dimensional shape may geometrically hinder sunlight from reaching these surfaces. However, scattered sunlight may not be so hindered since such sunlight may arrive from substantially all skyward directions, whereas non-scattered sunlight may come from one direction, the sun. Cloudy skies produce such scattered sunlight.

Particular embodiments herein describe three-dimensional solar panels including pyramidal shapes, but claimed subject matter is not so limited, since any three-dimensional solar panel may provide advantages of increased surface area while keeping a fixed footprint, as described above. Herein, the term solar panels refers to a panel in a macroscopic sense, e.g., a panel that may be placed on a rooftop as suggested above, for example.

Figure 1:
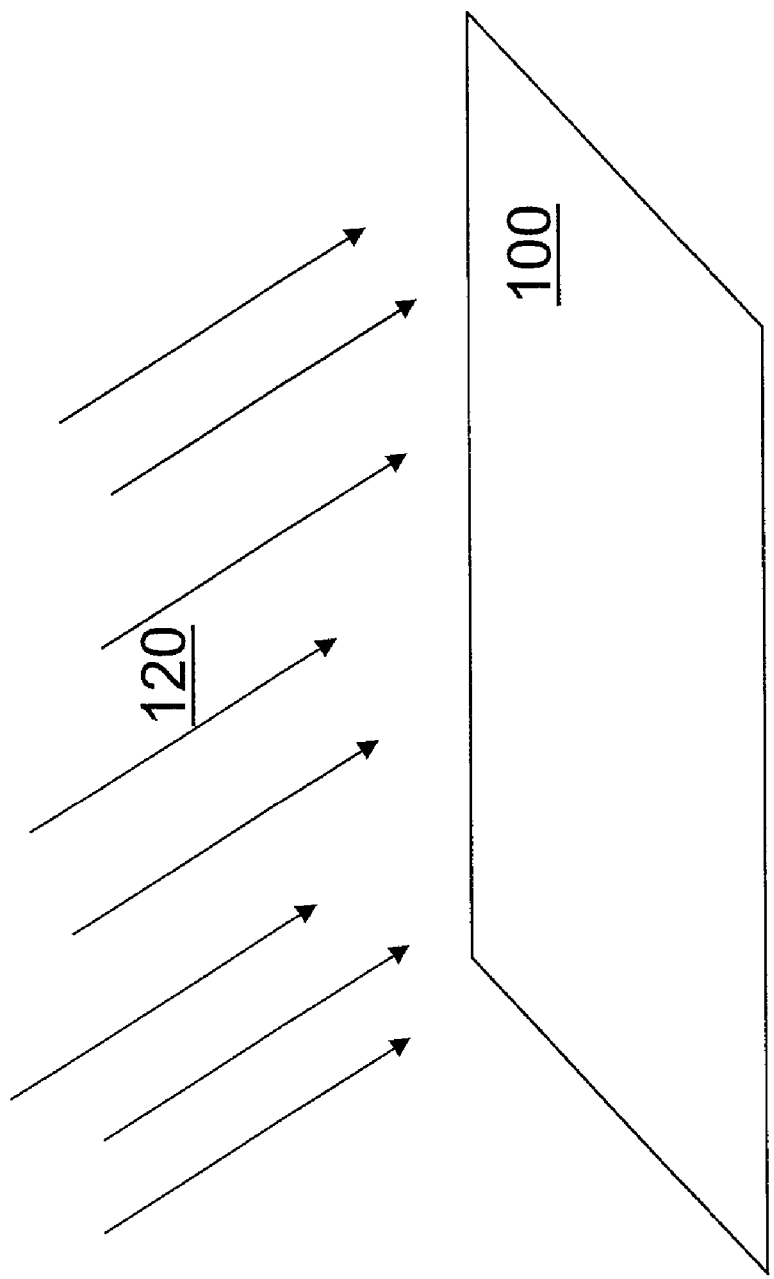
FIG. 1 is a schematic diagram illustrating light rays incident on a flat solar panel, according to an embodiment.

FIG. 1 is a schematic diagram illustrating light rays incident on a flat solar panel, according to an embodiment. During sunny weather, e.g., no clouds, light 120 from the sun may travel directly to a solar panel 100. A solar panel may change its angle so that sun light is incident perpendicular to the surface of the solar panel to increase solar gain efficiency.

Figure 2:
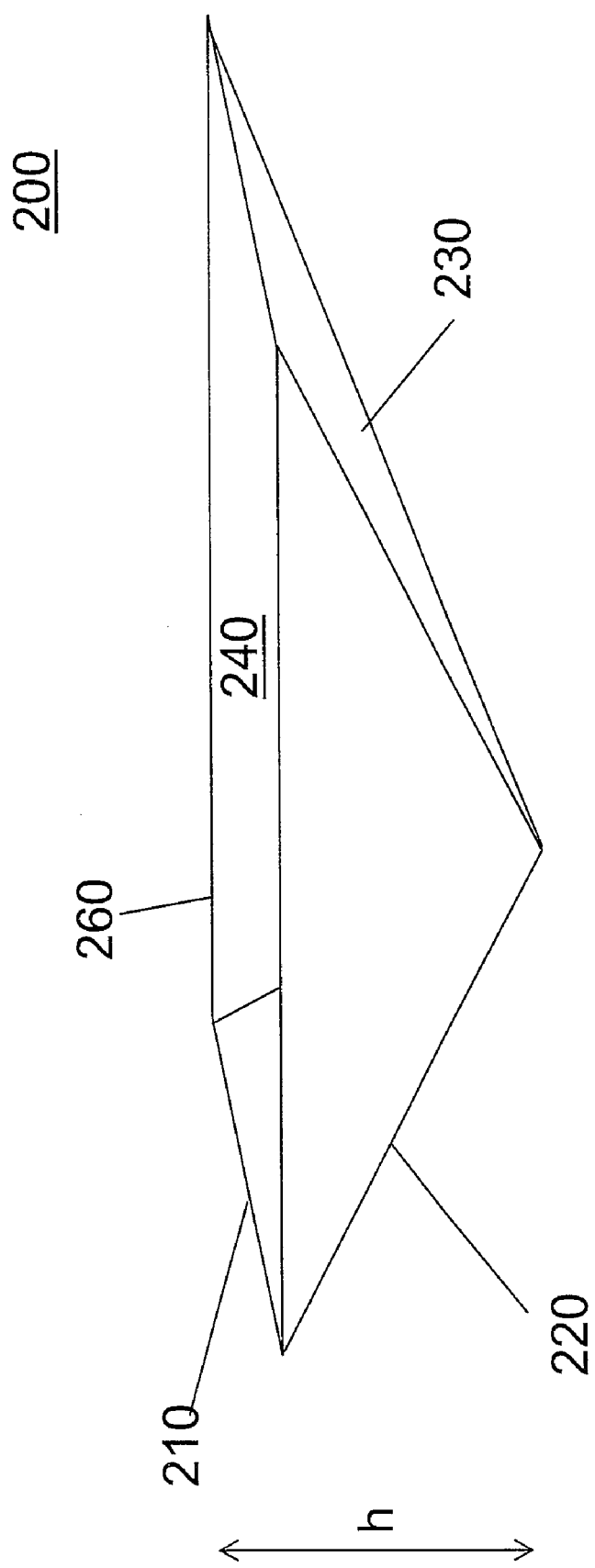
FIG. 2 is a schematic diagram illustrating a solar panel, according to an embodiment.

FIG. 2 is a schematic diagram illustrating a solar panel 200, according to an embodiment. Solar panel 200 may have substantially an inverted four-sided pyramidal shape made from four individual solar panels 210, 220, 230, and 240, for example. Of course, it should be understood that such shapes need not be considered inverted since an array of such shapes may not be considered inverted, depending on which portion of the array is viewed. Such a pyramidal shape is not limited to being four-sided. Other embodiments may include three-sided, or a pyramidal shape having more than four sides. Still other embodiments may include sides of a pyramidal shape that are truncated. Still other embodiments may include non-pyramidal shapes. For example, whereas a four-sided pyramidal shape has a square cross-section, and a three-sided pyramidal shape has a triangular cross-section, another embodiment may have a substantially circular cross-section, a substantially oval cross-section, and other shapes that may be manifested by various three-dimensional solar panel configurations. As shown in FIG. 2, individual light-collecting surface areas of individual solar panels 210, 220, 230, and 240 may face one another. In other words, the light-collecting surface of one or more such panels may be visible from the light-collecting surface of another such panel, as shown in FIG. 2, though claimed subject matter is not limited to the configuration of FIG. 2, as explained below. Herein, the term light-collecting surface refers to the surface area of a solar panel that collects light that is used to generate electricity. Such an area may also be referred to as an active region of a solar panel.

Figure 5:
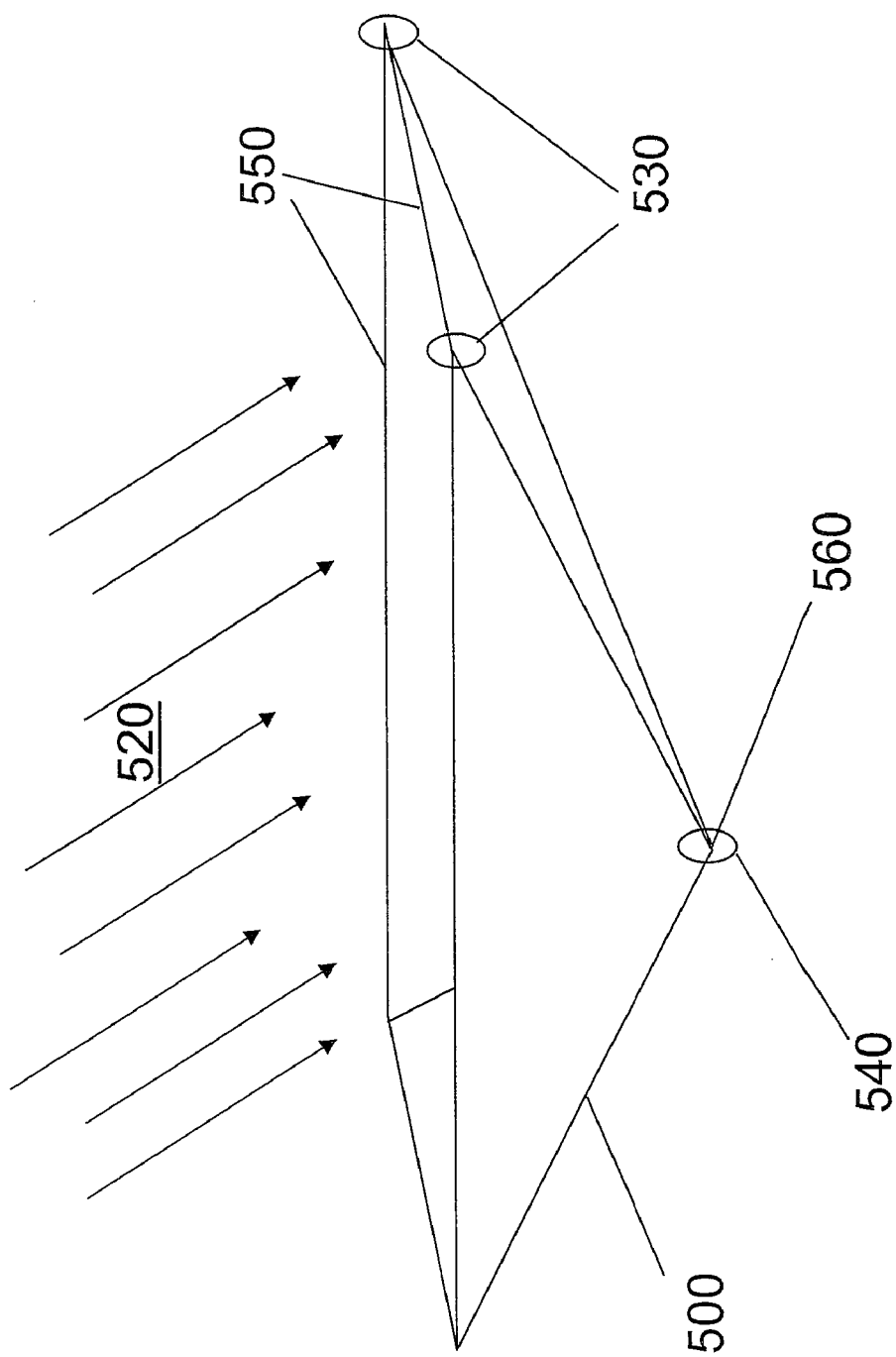
FIG. 5 is a schematic diagram illustrating a solar panel enabled to change shape, according to an embodiment.

Perimeter 260 of solar panel 200 may define a surface area, which may include the footprint of solar panels 200. Such a footprint, and it's meaning, is described above. A height "h" of solar panel 200 may be determined to optimize solar gain. For example, if "h" is too large, then solar panel surface area may be large but solar radiation may not reach lower portions of solar panel 200 (e.g., near apex 560, as shown in FIG. 5). On the other hand, if "h" is too small, solar radiation may reach all portions of solar panel 200 but surface area may not be significantly large.

Figure 7:
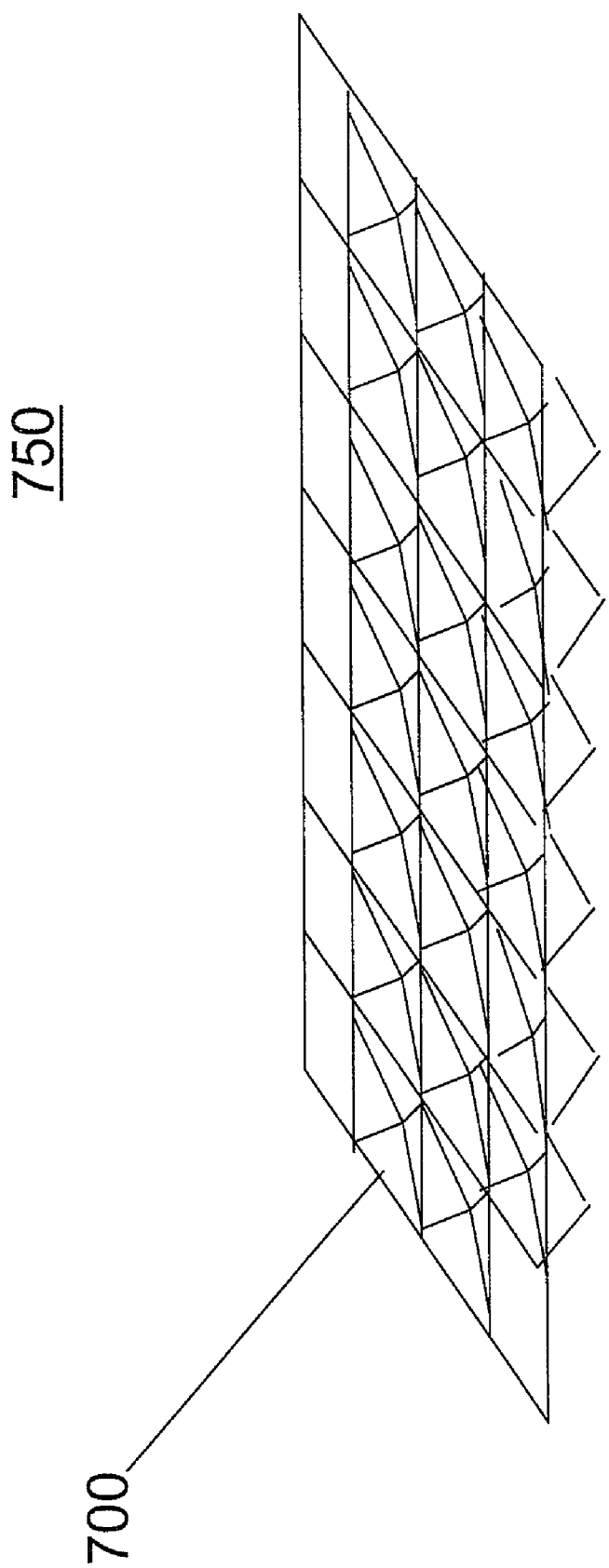
FIG. 7 is a schematic diagram illustrating an array of solar panels, according to an embodiment.

Solar panel 200 may be placed next to one or more similarly-shaped solar panels. For example, FIG. 7 shows an array of such panels, which will be discussed further below.

Individual solar panels 210, 220, 230, and 240 may be coupled to one another electrically and/or mechanically, or such panels may be configured so that their respective electrical connections are separate. In a particular embodiment, one or more of individual solar panels 210, 220, 230, and 240 may be connected to one another along their respective edges. In another particular embodiment, individual solar panels 210, 220, 230, and 240 may be spaced apart and/or not connected to one another.

In another embodiment, solar panels 210, 220, 230, and 240 may comprise a single, or one or more solar panels. Such a single solar panel, for example, may be curved or bent to produce a pyramidal shape.

In an embodiment a "three-dimensional" solar panel 200 has an increased solar-receiving surface area compared to a flat solar panel 100 for a given perimeter area. Perimeter area, or footprint area, in this context may refer to an area of earth or roofing, for example, that either solar panel may cover. For example, in a particular embodiment, solar panel 200 may comprise a square pyramid having a height "h" and a square base with sides of length "s". In such a case, the area of the base is $s^2$, which may be the same area as a flat solar panel 100 with a side of length "s". But in the case of a pyramid shape, we have an additional area term, which is $s(s^2+4h^2)^{1/2}$. Accordingly, we may double, for example, the solar-gaining surface area of a solar panel by going from a flat solar panel 100 to a three-dimensional solar panel 200. Other shapes of solar panel are possible, such as a three-sided pyramid, and/or pyramids that do not necessarily have planer portions (e.g., sides. In other words, the sides of a pyramid may be curved or sagging, or faceted, for example) and so on, and claimed subject matter is not limited to a pyramidal shape. One may be concerned with an efficiency of packing in a two-dimensional space, for example, how tight can we pack our three-dimensional solar panels on a rooftop or the ground? Four and three-sided pyramids may be packed with 100% efficiency (see FIG. 7, for example), but other three-dimensional shapes may also have high packing efficiencies.

The idea of increasing solar gain is to increase surface area of solar panels while keeping the solar panels' footprint constant—this may include configuring solar panels with a third dimension, such as a depth. Pyramidal shapes compared to squares or triangles, for example, do this. And the pyramidal shapes may include angular sides to increase solar reception, compared to sides that are parallel to each other and do not pick up solar radiation as well.

In an embodiment, three-dimensional solar panels may comprise a shape similar to that of an egg carton, including the concave depression. Such an egg carton configuration is found in foam mattresses and packaging, for example. Three-dimensional solar panels may also use such a shape. Of course, this is merely an example, and claimed subject matter is not so limited.

If cloudy skies yield lower levels of solar radiation, then we can compensate by utilizing three-dimensional solar panels that have increased surface area compared to flat solar panels. Three-dimensional solar panels may not work as efficiently as flat solar panels positioned towards the sun during cloudless, sunny skies, but three-dimensional solar panels may work more efficiently than flat solar panels during cloudy skies.

Three-dimensional solar panels may actually provide an advantage to having cloudy skies compared to sunny skies: Flat solar panels generally require mechanical means to position the flat solar panels so that their surface is substantially perpendicular to the solar rays. Such positioning may be readjusted continuously throughout the day, as the sun changes position in the sky. Such mechanical means may be costly. On the other hand, three-dimensional solar panels need not be positioned to optimize their solar radiation reception because they work with cloudy days that produce scattered radiation. Accordingly, three-dimensional solar panels may not need any mechanical means to readjust their position relative to the position of the sun in the (cloudy) sky.

Figure 3:
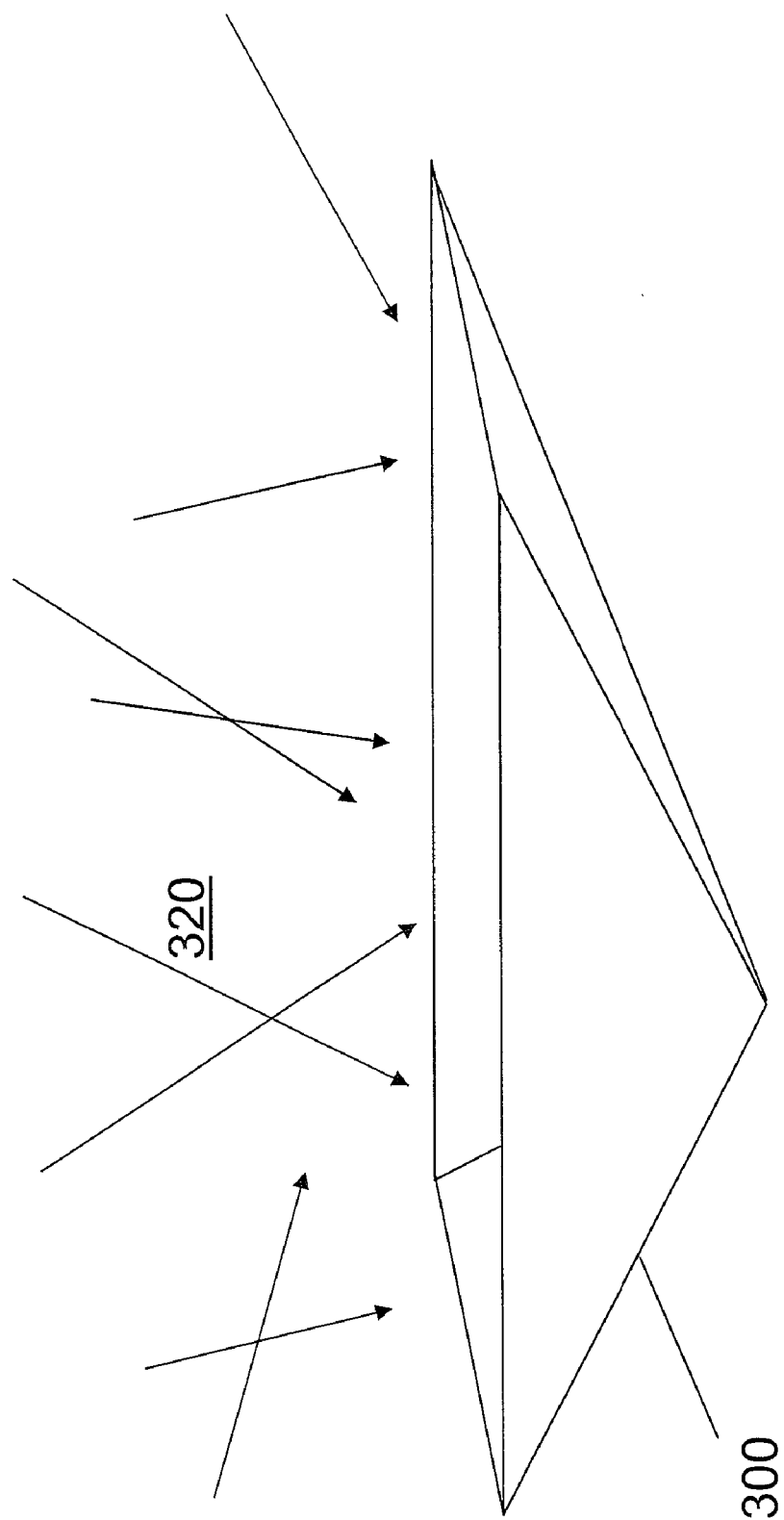
FIG. 3 is a schematic diagram illustrating scattered light rays incident on a solar panel, according to an embodiment.

FIG. 3 is a schematic diagram illustrating scattered light rays incident on a solar panel 300, according to an embodiment. Solar panel 300 may be similar to that shown in FIG. 2, for example. During a cloudy day, for example, light rays from the sun may be scattered by the clouds. Such scattered light rays 320 may be incident on solar panel 300 from random directions. Because of the random scattered light directions, all individual solar panels 210, 220, 230, and 240 (FIG. 2) may receive substantially equal amounts of the scattered light 320. Or in another embodiment, all sides of solar panel 300 may receive substantially equal amounts of the scattered light 320. Of course, these are merely examples, and light may impinge on one individual panel more than another. Furthermore, claimed subject matter is not so limited.

Figure 4:
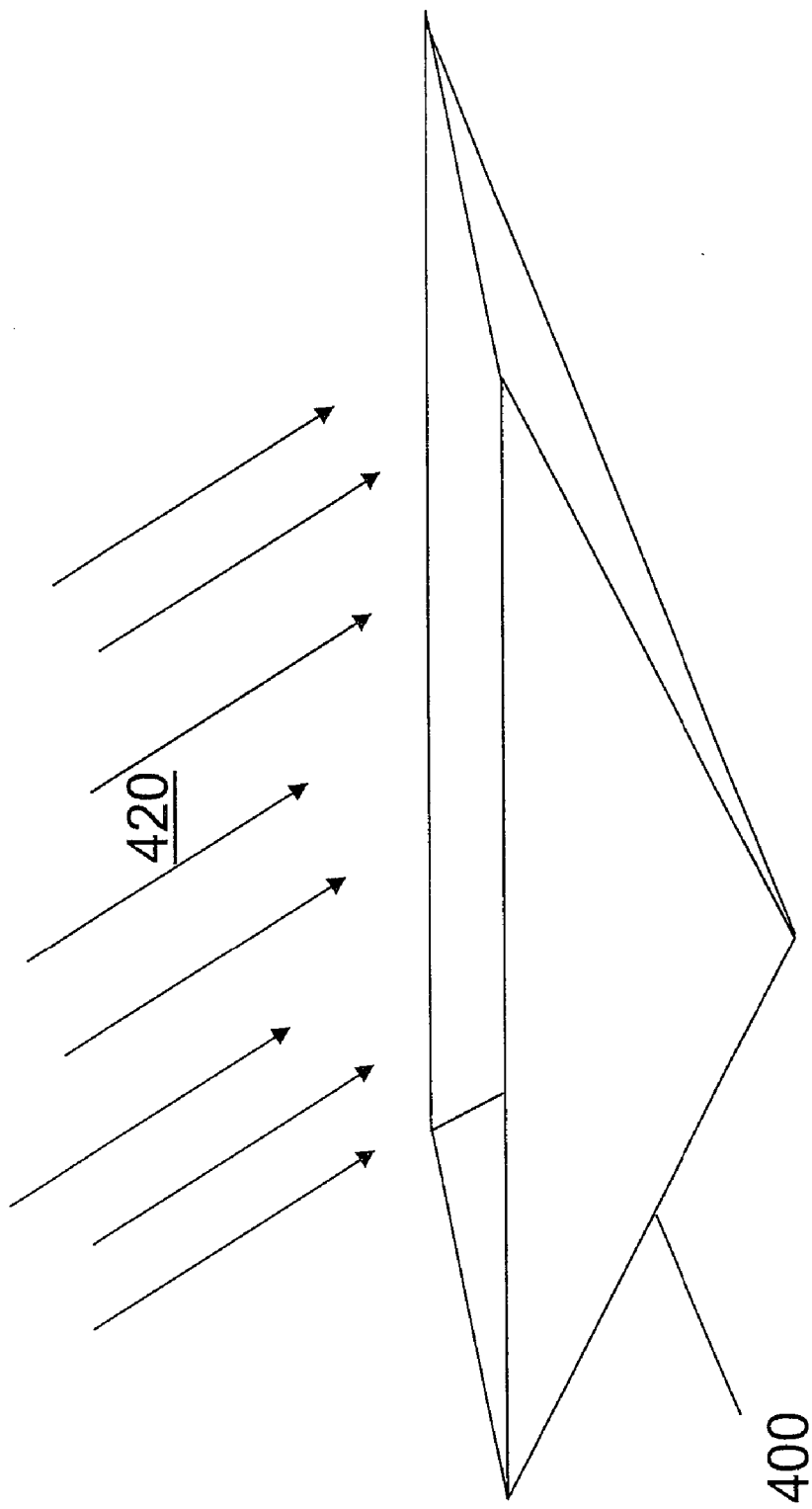
FIG. 4 is a schematic diagram illustrating collimated light rays incident on a solar panel, according to an embodiment.

FIG. 4 is a schematic diagram illustrating collimated light rays incident on a solar panel 400, according to an embodiment. On a sunny day, light from the sun may not be scattered by clouds, so that such light 420 is substantially collimated. In this case, one of the sides and/or portions of solar panel 400, or one of the individual solar panels 210, 220, 230, and 240 as in FIG. 2, may receive more light than other sides, portions, and/or panels. In an embodiment, solar panel 400 may be configured to change shape so that sides, or individual solar panels 210, 220, 230, and 240, may be positioned to receive as much light as possible. For example, individual solar panels 210, 220, 230, and 240 may change their respective position by means shown in FIG. 5, explained below.

FIG. 5 is a schematic diagram illustrating a solar panel 500 enabled to change shape, according to an embodiment. Hinges or other mechanisms to enable angular position changes of individual solar panels 210, 220, 230, and 240 (FIG. 2) may be included with solar panel 500. In a particular implementation, hinges 540 may be placed at or near an apex 560 of individual solar panels 210, 220, 230, and 240 to allow the individual solar panels to rotate substantially about their apex. A piston or other mechanism (not shown) may be connected to another portion of the individual solar panels to drive a rotation about the hinge position at 560. In another particular implementation, hinges 530 may be placed at edges 550 of individual solar panels 210, 220, 230, and 240 to allow the individual solar panels to rotate about their edges. A piston or other mechanism (not shown) may be connected to another portion of the individual solar panels to drive a rotation about the hinge position at 550. FIG. 6 shows two embodiments of solar panel 500 laid flat by the action of pistons (not shown) and hinges), according to an embodiment, as explained below.

Figure 6B:
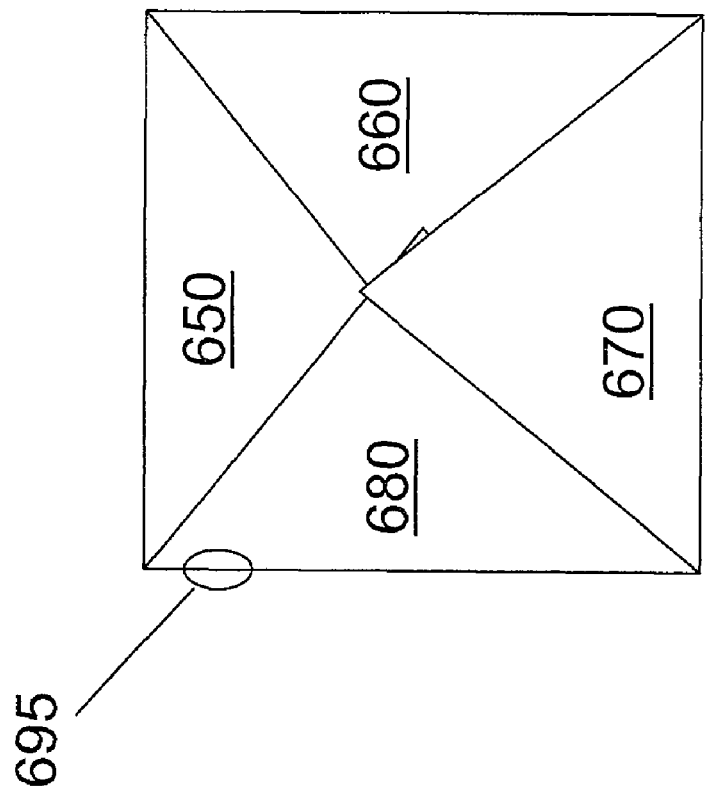
FIGS. 6A and 6B are schematic diagrams illustrating a solar panels in a flat configuration, according to an embodiment.
Figure 6A:
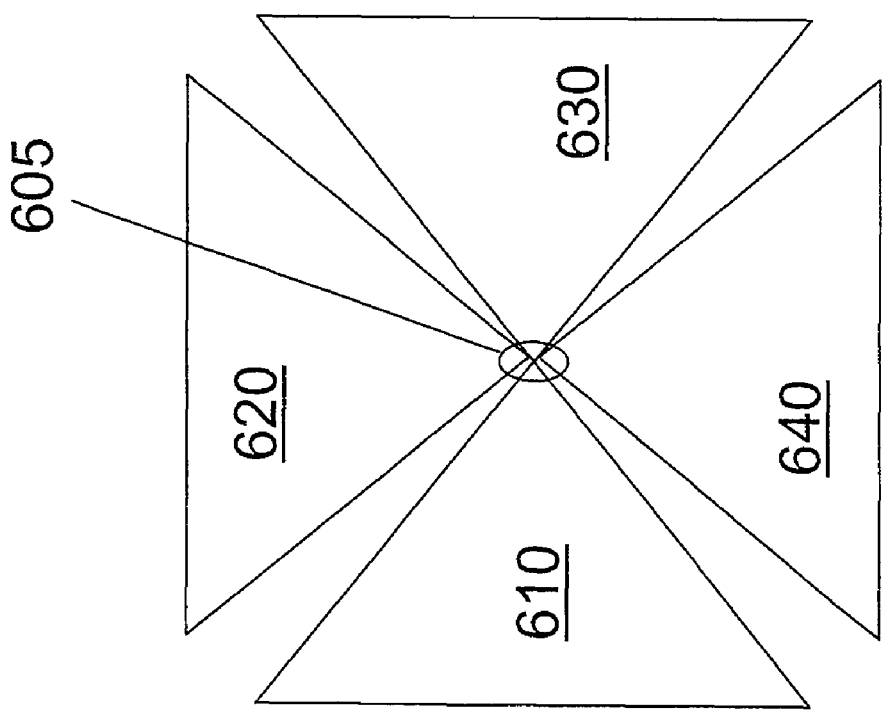

FIGS. 6A and 6B are schematic diagrams illustrating solar panels in a flat configuration, according to an embodiment. FIG. 6A may represent an embodiment of solar panel 500 with hinges 605 at the apexes of the individual solar panels 610, 620, 630, and 640. FIG. 6B may represent an embodiment of solar panel 500 with hinges 695 at the edges of the individual solar panels. In this latter embodiment, the panels may involve a sequence, wherein a first panel 650 is laid flat first (or begins an action of being laid flat first), then a second panel 660 is laid flat, then a third 680, and then a fourth 670, and so on, for example. In this way, the panels may not collide, as geometry dictates.

Solar panel 500, for example, may be laid flat during cloudless, sunny skies, when sunlight is substantially collimated. In this case, a flattened solar panel 500, as shown in either FIG. 6A or FIG. 6B, may be more efficient at capturing solar energy than the three-dimensional mode schematically illustrated in the embodiment of FIG. 5. But during cloudy days, a three-dimensional solar panel may be more efficient at capturing solar energy than a flattened mode shown in FIGS. 6A and 6B.

FIG. 7 is a schematic diagram illustrating an array 750 of solar panels 700, according to an embodiment. Such an array may be located in a field, a roof top, and so on. Perimeters of pyramidal-shaped solar panels, as described above, may be physically separated from a surface of a field or roof top on which such panels are mounted. This may be the case if an inward surface of the pyramidal-shaped solar panel is used to collect light to generate electricity. In such a case, as can be realized by viewing FIG. 7, array 750 may involve less surface contact between array 750 and a mounting surface (such as a roof top or ground) compared with mounting array 750 with pyramid perimeters contacting such a mounting surface (such as with array 750 upside down with respect to what is shown in FIG. 7). Packing of solar panels 700, which may be similar to solar panels 200 of FIG. 2, may be 100% efficient for pyramidal shapes, for example, while other shapes may provide less packing efficiency. Array 750 may include any number of solar panels, each of which need not be identical, for example.

In another embodiment, such three-dimensional solar panels, as shown in FIG. 2 for example, may be implemented on a physically unstable surface, such as on a floating vessel in the ocean. Such a vessel, or ship, may be rocked around by wave action. In such a situation, a three-dimensional solar panel may receive solar radiation relatively efficiently without involving its careful positioning and alignment, such as may be necessary for efficient operation of a flat solar panel. Accordingly, three-dimensional solar panels may work relatively well rigidly mounted to part of a sea-going vessel even while the vessel is rocked about my ocean waves. In a particular implementation, such three-dimensional solar panels, as shown in FIG. 2 for example, may be implemented on a physically unstable surface that may be a dock or other floating device in the ocean or other body of water. Such a floating surface may provide "real estate" for solar energy generation. Using land area may be difficult, so areas over water, such as lakes or oceans, may be an economical alternative. Though such a floating surface, having three-dimensional panels attached thereon, may be rocked around by wave action, three-dimensional solar panels may receive solar radiation relatively efficiently without involving their careful positioning and alignment, such as may be necessary for efficient operation of a flat solar panel. Accordingly, three-dimensional solar panels may work relatively well rigidly mounted to part of a sea-bound (or other body of water) floating platform even while the platform is rocked about by waves. Additionally, large bodies of water are often associated with cloudy skies, and three-dimensional solar panels work efficiently in such weather conditions, as explained above.

In another embodiment, such three-dimensional solar panels, as shown in FIG. 2 for example, may be implemented on a physically vertical surface, such as the side of a building, for example. During cloudy skies, scattered solar radiation is available in substantially all directions, so a vertical surface, or an area under cover from a direct line of sight to the sun's position, may receive such scattered solar radiation. Accordingly, three-dimensional solar panels are relatively efficient at receiving such scattered radiation. Such surfaces and/or areas may be economically used compared with surfaces on the ground or roofs.

In another embodiment, such three-dimensional solar panels, as shown in FIG. 2, may be implemented on ground-based vehicles, air-based vehicles, and any vehicle that changes is position relative to the sun. A weather balloon may implement such solar panels. Other vehicles may include planes, trains, and automobiles, just to list a few examples. In addition to vehicles, persons may wear clothing, for example, that have such three-dimensional solar panels mounted on such clothing. There are no size limits regarding these solar panels, so relatively small ones, perhaps configured in a matrix of such panels, may be placed on a person, an animal, and so on.

In an embodiment, such three-dimensional solar panels, as shown in FIG. 2, may be implemented inside buildings. Such interior spaces include indirect lighting from windows, skylights, and/or artificial lighting. Such indirect lighting may include scattered light, which may be received by three-dimensional solar panels, as described above. Interior space surfaces that may receive such three-dimensional solar panels may include furniture, walls, floors, structural elements, and/or any surface that may be found inside a building. Such surfaces outside a building may also receive such three-dimensional solar panels. Of course, these are merely some examples, and claimed subject matter is not so limited.

In an embodiment, such three-dimensional solar panels, as shown in FIG. 2, may be implemented on window coverings, such as curtains, blinds, and/or shades. Skylight coverings may also be considered in this regard. Such window coverings, as with other interior spaces, may include indirect lighting from windows, skylights, and/or artificial lighting. Such indirect lighting may include scattered light, which may be received by three-dimensional solar panels, as described above. In an implementation, such window coverings may be included in outdoor spaces.

Figure 8:
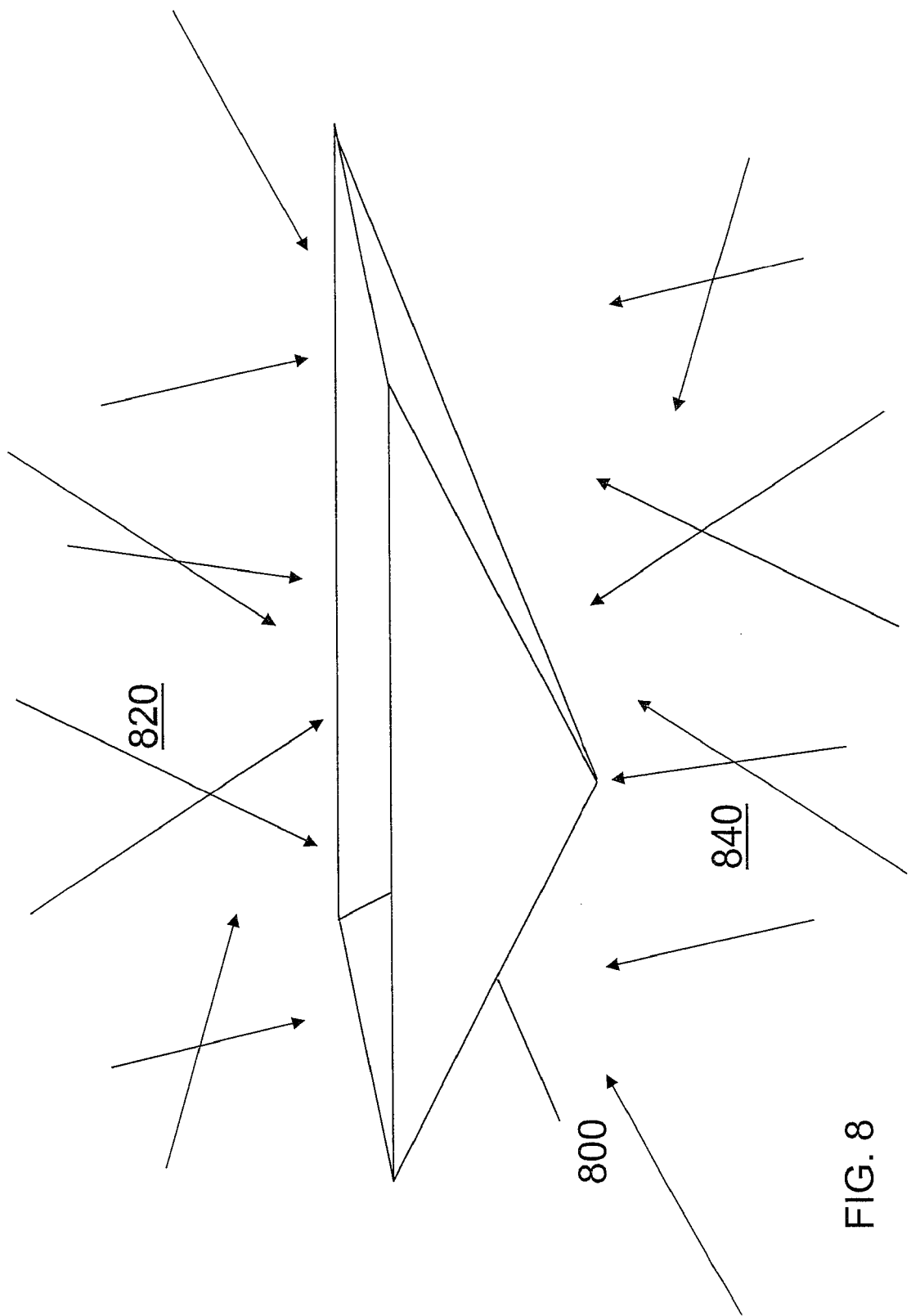
FIG. 8 is a schematic diagram illustrating that light may be received on both sides of a three-dimensional solar panel.

In an embodiment, such three-dimensional solar panels, as shown in FIGS. 2 and 3, may two-sided. That is, such solar panels may be configured to receive light on both opposite surfaces. Energy may be generated from both sides. For example, FIG. 8 shows that light 820 and 840 may be received on both sides of three-dimensional solar panel 800. To simplify description herein, and in terms of FIG. 8, the term "inward side" means the side of solar panel 800 that is receiving light 820, whereas the term "outward side" means the side of solar panel 800 that is receiving light 840. Such terms may also be used to describe other embodiments of a three-dimensional solar panel described above, such as for solar panels 200, 300, 400, and 500. For example, in FIG. 3, light 320 is shown incident on the inward side of solar panel 300. Accordingly, returning to FIG. 8, solar panel 800 may generate electricity by both receiving light 820 from its inward side and receiving light 840 from its outward side. Energy generation may be relatively efficient by capturing scattered light from many different directions on both sides of such a panel.

It should be understood that, although particular embodiments have been described, claimed subject matter is not limited in scope to a particular embodiment or implementation. Though the word "panel" is used, it should be understood that panel in the context of this disclosure is not limited to a plane structure, unless explicitly described as so. Further, a panel may comprise one or more individual units, be built from one or more separate structures, and/or comprise a single structure with folds and/or bends to result in a three-dimensional structure. Claimed subject matter is not so limited.

It should be understood that solar panel may refer to a material and/or a structure that is able to generate energy, particularly electricity, from light. Such light may be natural, as in sunlight, or artificial. Also, the term "solar" in "solar energy" should be understood to not be limited to that pertaining to the sun. Artificial light may apply in this context as well.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. An apparatus comprising:
    a solar panel configuration adapted to receive scattered light from a plurality of directions, said solar panel configuration comprising:
        three or more substantially triangular portions contiguously arranged to form a substantially pyramidal shape;
        an apex of said pyramidal shape toward which at least three of said three or more substantially triangular portions converge; and
        photovoltaic cells on said three or more substantially triangular portions to generate photovoltaic energy resulting from receiving said scattered light on the inward side of said substantially pyramidal shaped solar panel configuration.

2. The apparatus of claim 1, further comprising:
    a base perimeter of said pyramidal shape collectively formed by said three or more substantially triangular portions, wherein a light collecting area of said photovoltaic cells is greater than an area formed by said base perimeter.

3. The apparatus of claim 1, wherein said solar panel configuration is adapted to form a single row with one or more other of said solar panel configurations.

4. The apparatus of claim 1, wherein said substantially pyramidal shape comprises a four-sided pyramidal shape.

5. The apparatus of claim 1, wherein said solar panel configuration is adapted to transition between said substantially pyramidal shape and a substantially flat shape comprising said three or more substantially triangular portions.

6. The apparatus of claim 1, further comprising:
    a substantially straight ridge comprising a border shared between pairs of said three or more substantially triangular portions.

7. The apparatus of claim 2, wherein said substantially straight ridge extends from said apex to a base of said pyramidal shape.

8. A three-dimensional solar panel comprising:
    three or more substantially contiguous surfaces that form a substantially pyramidal shaped surface to receive scattered light on the inward side of said substantially pyramidal shaped surface;
    photovoltaic cells disposed on said three or more substantially contiguous surfaces;
    substantially straight ridges individually formed by pairs of said three or more substantially contiguous surfaces; and
    an apex toward which said three or more substantially contiguous surfaces converge.

9. The three-dimensional solar panel of claim 8, wherein individual sides of said substantially pyramidal shaped surface are arranged to concurrently receive substantially equal amounts of said scattered light.

10. The three-dimensional solar panel of claim 8, wherein said photovoltaic cells disposed on said three or more substantially contiguous surfaces are adapted to receive said scattered light without use of a collimating lens.

11. The three-dimensional solar panel of claim 8, further comprising:
    a base perimeter at distal ends of said substantially straight ridges, wherein a light collecting area of said photovoltaic cells is greater than an area formed by said base perimeter.

12. The three-dimensional solar panel of claim 8, further comprising a hinging mechanism responsive to said received scattered light transitioning to collimated light to allow said three-dimensional solar panel to change shape.

13. The three-dimensional solar panel of claim 8, wherein said three or more substantially contiguous surfaces are adapted to be separated from one another along said substantially straight ridges.

* * * * *